United States Patent [19]
Hosoya

[11] Patent Number: 5,795,799
[45] Date of Patent: Aug. 18, 1998

[54] METHOD FOR MANUFACTURING ELECTRONIC APPARATUS SEALED BY CONCAVE MOLDED RESIN ENVELOPER

[75] Inventor: Futoshi Hosoya, Tokyo, Japan

[73] Assignee: NEC Corporation, Japan

[21] Appl. No.: 660,184

[22] Filed: May 31, 1996

[30] Foreign Application Priority Data

May 31, 1995 [JP] Japan .................. 7-133973

[51] Int. Cl.$^6$ .................. H01L 21/44
[52] U.S. Cl. .................. 438/126; 438/107
[58] Field of Search .................. 438/106, 107, 438/126, 125

[56] References Cited

U.S. PATENT DOCUMENTS

| | | | |
|---|---|---|---|
| 4,633,573 | 1/1987 | Scherrer | 438/126 |
| 5,219,795 | 6/1993 | Kumai et al. | 438/107 |
| 5,547,730 | 8/1996 | Weiblen et al. | 438/126 |
| 5,602,059 | 2/1997 | Horiuchi et al. | 438/126 |

FOREIGN PATENT DOCUMENTS

| | | |
|---|---|---|
| 3-211763 | 9/1991 | Japan . |
| 4-256344 | 9/1992 | Japan . |
| 5-259372 | 10/1993 | Japan . |

*Primary Examiner*—Kevin Picardat
*Attorney, Agent, or Firm*—Hayes, Soloway, Hennessey, Grossman & Hage, P.C.

[57] ABSTRACT

In a method for manufacturing an electronic apparatus, an electronic component is mounted on an organic substrate within its cavity. The electronic component is sealed by a concave molded resin enveloper filled into the cavity.

19 Claims, 6 Drawing Sheets

METHOD FOR MANUFACTURING ELECTRONIC APPARATUS SEALED BY CONCAVE MOLDED RESIN ENVELOPER

BACKGROUND OF THE INVENTION

1. Field of the Invention

The present invention relates to a method for manufacturing an electronic apparatus.

2. Description of the Related Art

Generally, in an electronic apparatus, components are mounted on both first and second surfaces of a substrate, thus increasing the density of mounted components. In this case, a cavity is provided on the first surface of the substrate, and a component is mounted on the first surface of the substrate within the cavity. Then, the apparatus is reversed, and another component is mounted on the second surface of the substrate. Note that, unless the cavity is provided on the surface of the substrate, it is impossible to reverse the apparatus.

In a first prior art method (see JP-A-3-211763), the substrate is made of ceramic. Therefore, since the substrate is rigid, semiconductor chips are mounted on both the first and second surfaces of the substrate and stable wire bonding operations are performed thereupon. Also, the semiconductor chips are sealed by convex thermosetting resin envelopers. This will be explained later in detail.

In the first prior art method, however, in order to compensate for the fluctuation of height of the molded resin enveloper, the depth of the cavity is made large. As a result, a step between the molded resin enveloper and the first surface of the substrate becomes large. This makes it difficult to determine whether or not the appearance of the molded resin enveloper is bad, i.e., whether or not the molded resin enveloper is protruded from the cavity. Note that if the molded resin enveloper is protruded from the cavity, it is impossible to reverse the apparatus for preparing the wire bonding operation performed upon the second surface of the substrate. Also, the above-mentioned large step increases the size of the apparatus. Further, the ceramic substrate is heavy and expensive. Still further, it is difficult to mount this apparatus on an organic mounting board which is broadly used, since a difference in thermal expansibility between the ceramic substrate and the organic mounting board creates stress therebetween, so that cracks and disconnections may be generated in the ceramic substrate and the organic mounting board as time passes.

In a second prior art method (see JP-A-5-259372), the substrate is made of organic material. This also will be explained later in detail.

In the second prior art method, however, since the organic substrate is flexible, a stable wire bonding operation cannot be performed upon the second surface of the organic substrate. This reduces the density of mounted chips.

Also, in the second prior art method, in order to compensate for the fluctuation of height of the molded resin enveloper, the depth of the cavity is made large. As a result, a step between the molded resin enveloper and the first surface of the substrate becomes large. This makes it difficult to determine whether or not the appearance of the molded resin enveloper is bad, i.e., whether or not the molded resin enveloper is protruded from the cavity.

Further, in the second prior art method, if the apparatus is large, a difference in thermal expansibility between the substrate and the molded resin enveloper makes the apparatus warp, so that it is impossible to amount the apparatus on a mounting board.

SUMMARY OF THE INVENTION

It is an object of the present invention to provide a method for manufacturing a small size electronic apparatus sealed by a molded resin enveloper in which it is easy to determine whether or not the appearance of the molded resin enveloper is bad, and which increases the density of mounted chips.

According to the present invention, in a method for manufacturing an electronic apparatus, an electronic component is mounted on an organic substrate within its cavity. The electronic component is sealed by a concave molded resin enveloper filled into the cavity. Thus, even if the organic substrate is flexible, the combination of the organic substrate and the concave molded resin enveloper are rigid due to the concave configuration thereof.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENT

Before the description of the preferred embodiment, prior art methods for manufacturing an electronic apparatus will be explained with reference to FIGS. 1A through 1E and FIGS. 2A through 2D.

FIGS. 1A through 1E illustrate a first prior art method for manufacturing an electronic apparatus (see JP-A-3-211763).

Figure 1A:
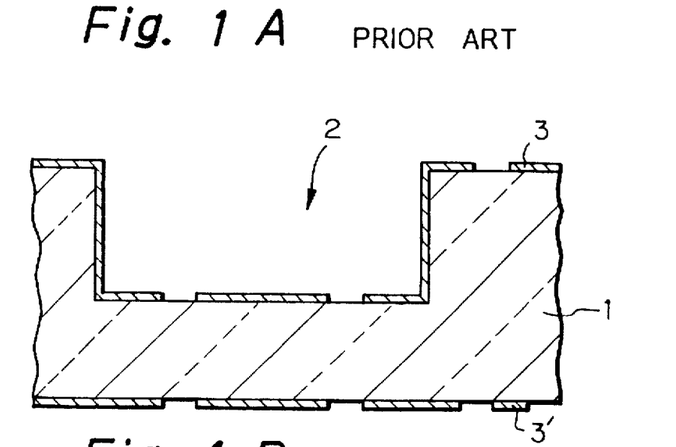
FIGS. 1A through 1E are cross-sectional views for explaining a first prior art method for manufacturing an electronic apparatus.

First, referring to FIG. 1A, a ceramic substrate 1 having first and second surfaces is provided, and a cavity 2 is formed in the first surface of the ceramic substrate 1. An electrode pattern 3 is formed on the first surface of the ceramic substrate 1, and an electrode pattern 3' is formed on the second surface of the ceramic substrate 1.

Figure 1B:
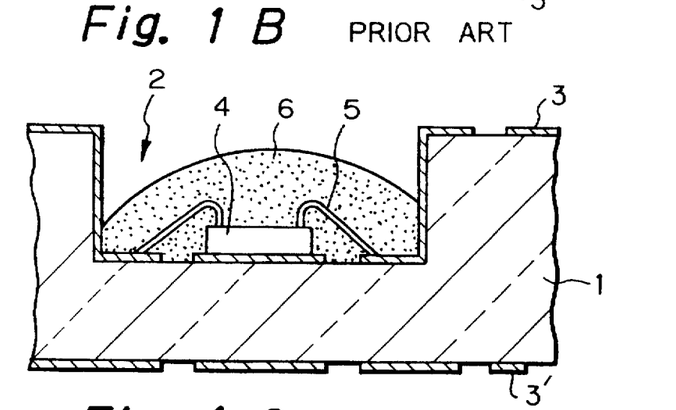

Next, referring to FIG. 1B, a semiconductor chip 4 is mounted within the cavity 2 on the first surface of the ceramic substrate 1 by conductive or insulating adhesives, and wires 5 are bonded between the electrode pattern 3 and the semiconductor chip 4. Then, thermosetting resin is introduced into the cavity 2 to seal the semiconductor chip 4 as well as the wires 5. In this case, the surface of a molded resin enveloper 6 is convex.

Figure 1C:
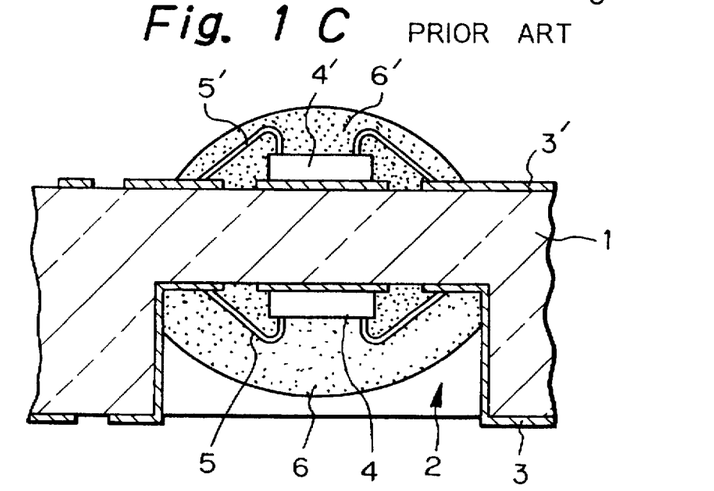
Figure 1D:
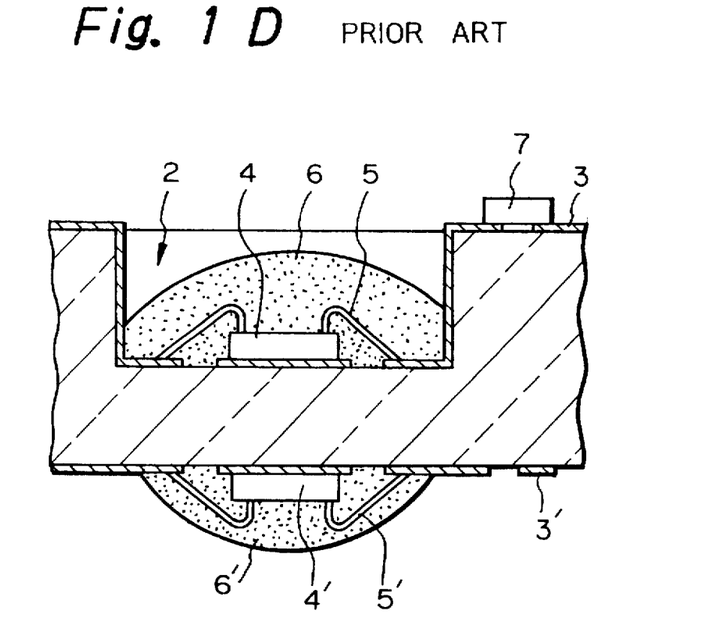
Figure 1E:
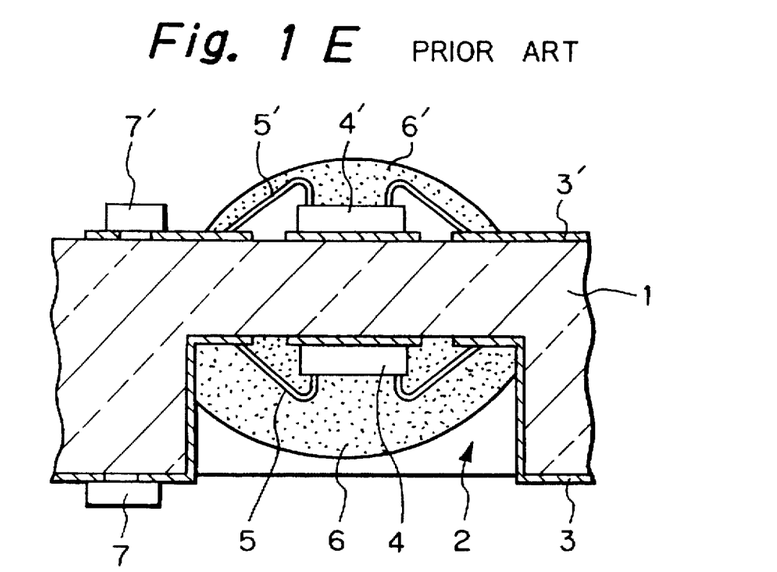

Next, referring to FIG. 1C, the apparatus is reversed. Then, a semiconductor chip 4' is mounted on the second surface of the ceramic substrate 1 by conductive or insulating adhesives (not shown), and wires 5' are bonded between the electrode pattern 3' and the semiconductor chip 4'. Then, thermosetting resin is introduced onto second surface of the ceramic substrate 1 to seal the semiconductor chip 4' as well as the wires 5'. In this case, the surface of a molded resin enveloper 6' is also convex.

Next, referring to FIG. 1D, the apparatus is again reversed, and a chip capacitor 7 is mounted by soldering or conductive adhesives on the first surface of the ceramic substrate 1.

Finally, referring to FIG. 1E, the apparatus is again reversed, and a chip capacitor 7' is mounted by soldering or conductive adhesives on the second surface of the ceramic substrate 1, thus completing the apparatus.

In the first prior art method as illustrated in FIGS. 1A through 1E, since the ceramic substrate 1 is rigid, a stable wire bonding operation can be performed upon both the first and second surfaces of the ceramic substrate 1, so that the wires 5 and 5' are formed.

In the first prior art method, however, in order to compensate for the fluctuation of height of the molded resin enveloper 6, the depth of the cavity 2 is made large. As a result, a step between the molded resin enveloper 6 and the first surface of the ceramic substrate 1 becomes large. This makes it difficult to determine whether or not the appearance of the molded resin enveloper 6 is bad, i.e., whether or not the molded resin enveloper 6 is protruded from the cavity 2. Also, this increases the size of the apparatus. Further, the ceramic substrate 1 is heavy and expensive. Still further, it is difficult to mount the apparatus of FIG. 1E on an organic mounting board which is broadly used, since a difference in thermal expansibility between the ceramic substrate 1 and the organic mounting board creates stress therebetween, so that cracks and disconnections may be generated in the ceramic substrate 1 and the organic mounting board as time passes.

FIGS. 2A through 2D illustrate a second prior art method for manufacturing an electronic apparatus (see JP-A-5-259372).

Figure 2:
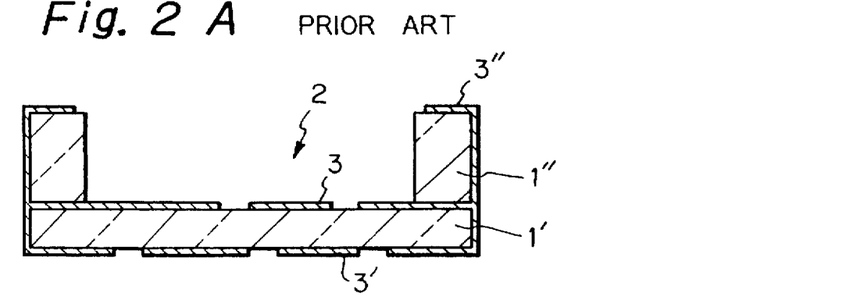
FIGS. 2A through 2D are cross-sectional views for explaining a second prior art method for manufacturing an electronic apparatus.

First, referring to FIG. 2A, an organic base substrate 1' having first and second surfaces is provided, and a framed organic connection substrate 1' is formed on the organic base substrate 1', thus forming a cavity 2 in the first surface of the organic base substrate 1'. An electrode pattern 3 is formed on the first surface of the organic base substrate 1', and an electrode pattern 3' is formed on the second surface of the organic base substrate 1'. Also, the electrode patterns 3 and 3' are connected to an electrode pattern 3" formed on the organic connection substrate 1".

Next, referring to FIG. 2B, a semiconductor chip 4 is mounted within the cavity 2 on the first surface of the organic base substrate 1' by conductive or insulating adhesives, and wires 5 are bonded between the electrode pattern 3 and the semiconductor chip 4. Then, a chip capacitor 7 is mounted by soldering or conductive adhesives on the first surface of the organic base substrate 1'.

Next, referring to FIG. 2C, thermosetting resin is introduced into the cavity 2 to seal the semiconductor chip 4 as well as the wires 5. In this case, the surface of a molded resin enveloper 6 is convex.

Finally, referring to FIG. 2D, the apparatus is reversed, and chip capacitors 7' and 7" and a mold component 8 are mounted by soldering or the like on the second surface of the organic base substrate 1', thus completing the apparatus.

In the second prior art method, however, since the organic base substrate 1' is flexible, a stable wire bonding operation can not be performed upon the second surface of the organic base substrate 1', so that the chip capacitors 7' and 7" and the molded component 8 can be mounted on the second surface of the organic base substrate 1', but a semiconductor chip cannot be mounted thereon. This reduces the density of mounted chips.

Also, in the second prior art method, in order to compensate for the fluctuation of height of the molded resin enveloper 6, the depth of the cavity 2 is made large. As a result, a step between the molded resin enveloper 6 and the first surface of the organic base substrate 1' becomes large. This makes it difficult to determine whether or not the appearance of the molded resin enveloper 6 is good, and increases the size of the apparatus. Further, if the apparatus of FIG. 2D is large, a difference in thermal expansibility between the substrate 1' and the molded resin enveloper 6 makes the apparatus of FIG. 2D warp, so that it is impossible to amount the apparatus of FIG. 2D on a mounting board.

FIGS. 3A through 3F illustrate an embodiment of the method for manufacturing an electronic apparatus according to the present invention.

Figure 3A:
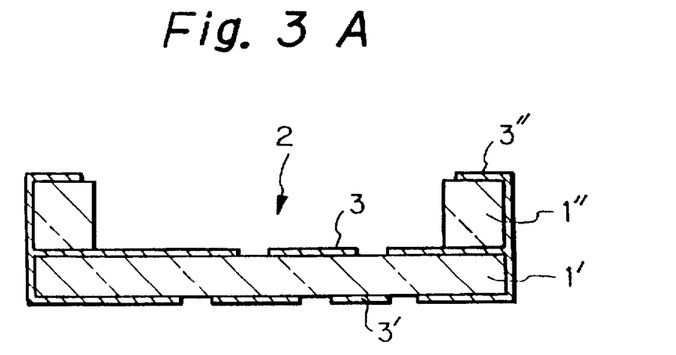
FIGS. 3A through 3F are cross-sectional views for explaining an embodiment of the method for manufacturing an electronic apparatus according to the present invention.

First, referring FIG. 3A, in the same way as in FIG. 2A, an organic base substrate 1' having first and second surfaces is provided, and an about 0.1 to 1 mm thick framed organic connection substrate 1" is formed on the organic base substrate 1', thus forming a cavity 2 in the first surface of the organic base substrate 1'. An electrode pattern 3 is formed on the first surface of the organic base substrate 1', and an electrode pattern 3' is formed on the second surface of the organic base substrate 1'. Also, the electrode patterns 3 and 3' are connected to an electrode pattern 3" formed on the organic connection substrate 1". Note that the organic base substrate 1' and the organic connection substrate 1" are made of the same material such as glass-expoxy, and thus there is little stress between the organic base substrate 1' and the organic connection substrate 1".

Figure 3B:
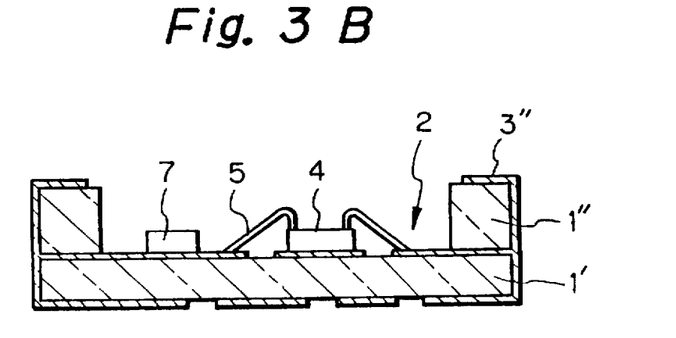

Next, referring to FIG. 3B, in the same way as in FIG. 2B, a semiconductor chip 4 is mounted within the cavity 2 on the first surface of the organic base substrate 1' by conductive or insulating adhesives (not shown), and wires 5 are bonded between the electrode pattern 3 and the semiconductor chip 4. Then, a chip capacitor 7 is mounted by soldering or conductive adhesives on the first surface of the organic base substrate 1'. Note, that a difference in height between the organic connection substrate 1" and the wires 5 is about 0.1 to 0.5 mm.

Figure 3C:
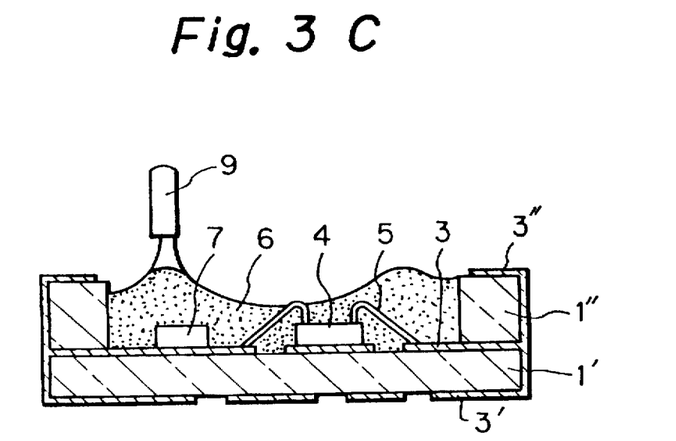
Figure 3D:
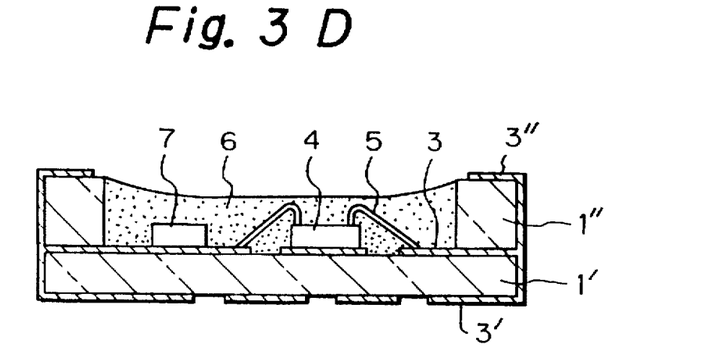

Next, referring to FIG. 3C, liquid thermosetting epoxy resin is introduced from a dispensing needle 9 into the cavity 2 from peripheral portion thereof to seal the semiconductor chip 4 as well as the wires 5 and the chip capacitor 7. In this case, the capacity of introduced resin is a little smaller than the cavity 2, and the viscosity of the resin is low so that the surface tension of the resin makes the surface thereof concave. Thereafter, the resin is heated and hardened as shown in FIG. 3D. In this case, the flexual modulus of a molded resin enveloper 6 is larger than 100 kg/mm$^2$, and therefore, the molded resin enveloper 6 hardly cracks even at a wire bonding operation temperature. In this case, the height of the organic connection substrate 1" is about 0.1 to 1 mm, and a difference in height between the maximum height of the wires 5 and the chip capacitor 7 and the organic connection substrate 1" is about 0.1 to 0.5 mm.

Figure 3E:
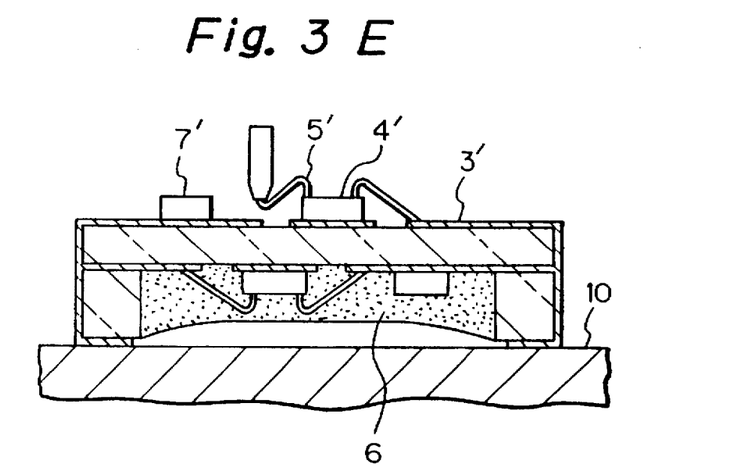

Next, referring to FIG. 3E, the apparatus is reversed. Then, a semiconductor chip 4' is mounted on the second surface of the organic base substrate 1' by conductive adhesives, and wires 5' are bonded between the electrode pattern 3' and the semiconductor chip 4'. In this case, the apparatus is located on a stage 10. Then, a chip capacitor 7' is mounted by soldering or conductive adhesives on the second surface of the organic base substrate 1'.

Figure 3F:
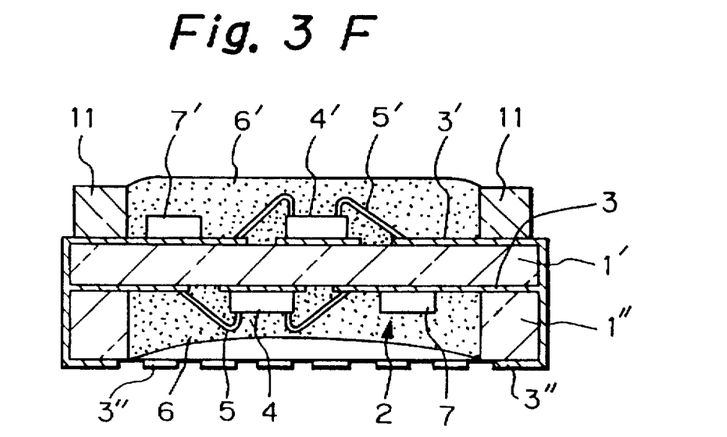

Finally, referring to FIG. 3F, a frame 11 made of glass-epoxy or the like is mounted on the second surface of the organic base substrate 1'. The configuration of the frame 11 is almost the same as that the organic connection substrate 1". Then, thermosetting resin is introduced onto the second surface of the organic base substrate 1' to seal the semiconductor chip 4' as well as the wires 5' and the chip capacitor 7', thus completing the apparatus. In this case, the surface of the molded resin enveloper 6' is almost flat at its center portion. Note that the molded resin enveloper 6' is made of the same material of the molded regin enveloper 6, so that a difference in thermal expansibility therebetween is almost zero. Thus, the apparatus hardly warps.

Thus, in the embodiment, even when the organic base substrate 1' is used, the combination of the organic base substrate 1' and the organic connection substrate 1" are rigid due to the concave configuration of the molded resin enveloper 6. As a result, the apparatus can be located on the stage 10 as illustrated in FIG. 3G, and a stable wire bonding operation can be performed upon the second surface of the organic base substrate 1'. This increases the density of mounted chips.

Also, in the embodiment, since the apparatus is almost symmetrical with respect to its longitudinal direction, the apparatus hardly warps so that it is easy to mount the apparatus on a mounting board.

Further, in the embodiment, since the molded resin enveloper 6 is concave, it is easy to determine whether or not the appearance of the molded resin enveloper 6 is bad, i.e., whether or not the molded resin enveloper 6 is protruded from the cavity 2. Therefore, the fluctuation of height of the molded resin enveloper 6 can be reduced, and accordingly, the depth of the cavity 2 can be reduced, thus reducing the size of the apparatus.

Figure 4:
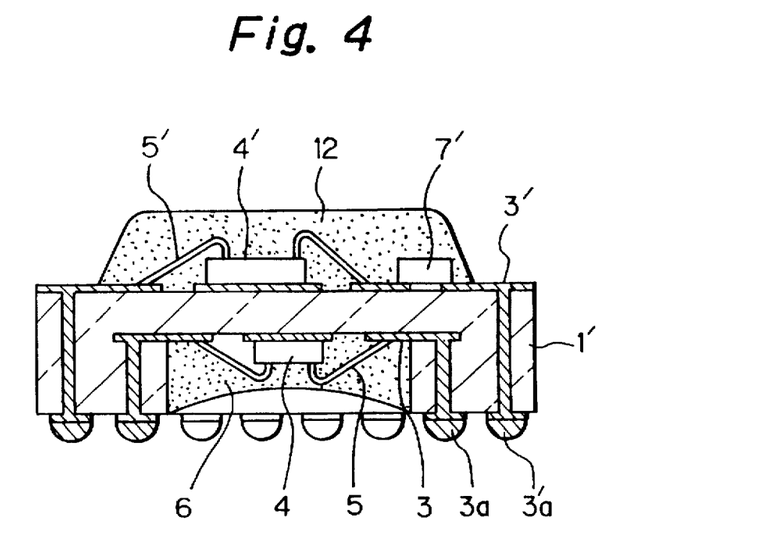
FIG. 4 is a cross-sectional view illustrating a modification of the apparatus of FIG. 3F.

In FIG. 4, which illustrates a modification of the apparatus of FIG. 3F, the semiconductor chip 4' as well as the bonding wires 5' and the chip capacitor 7' are sealed by transfer molding using a thermoplastic resin enveloper 12, instead of the thermosetting resin enveloper 6' and the frame 11 of FIG. 3F. That is, the apparatus of FIG. 3E is sandwiched by two metal molds (not shown). Then, hot thermoplastic resin is injected into a cavity between the metal molds, and the injected thermoplastic resin is cooled and hardened by the metal molds. Thus, a thermoplastic resin enveloper 12 is formed. Further, the electrode patterns 3 and 3' are connected hemispherical solder balls 3a and 3a', thus forming a ball grid array (BGA). Note that the enveloper 12 can be made of thermosetting resin.

Figure 5:
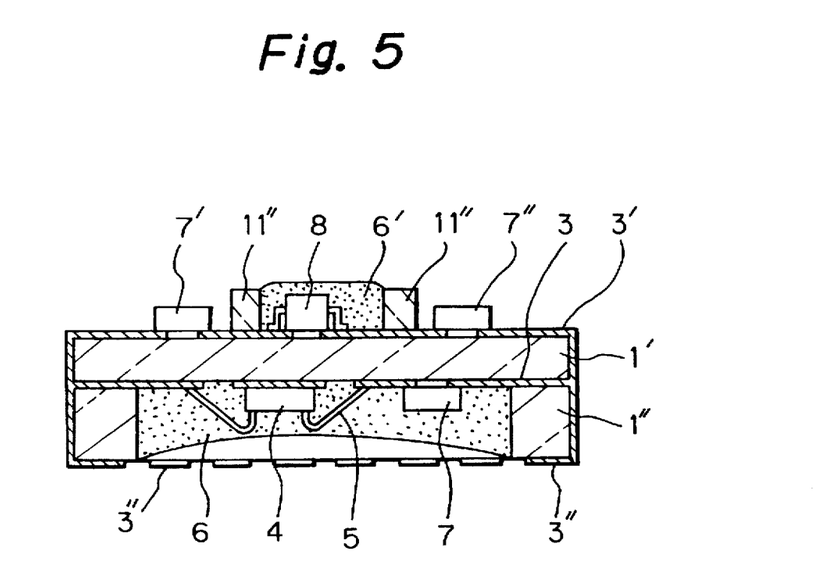
FIG. 5 is a cross-sectional view illustrating another modification of the apparatus of FIG. 3F.

In FIG. 5, which illustrates another modification of the apparatus of FIG. 3F, a mold component 8 instead of the semiconductor chip 4' of FIG. 3F is mounted on the second surface of the organic base substrate 1'. In this case, a small frame 11" is provided to surround the mold component 8, and the mold component 8 is sealed by a thermosetting resin enveloper 6'. Note that the apparatus is easily sucked by the nozzles (not shown), since the frame 11" is small.

As explained hereinabove, according to the present invention, since an organic substrate having a cavity is sealed by a concave molded resin enveloper, it is easy to determine whether or not the appearance of the molded resin enveloper is bad. Therefore, the molded resin enveloper can be thin, and accordingly the depth of the cavity can be reduced, thus reducing the size of the apparatus. Also, the organic substrate having a cavity can be rigid due to the concave configuration of molded resin in the cavity, stable wire bonding operation can be performed upon both surfaces of the organic substrate. Further, the density of mounted chips can be increased.

I claim:

1. A method for manufacturing an electronic apparatus comprising the steps of:

preparing an organic substrate having a cavity;

mounting a first electronic component on said organic substrate within said cavity; and sealing said first electronic component by a concave molded resin enveloper filled into said cavity.

2. The method as set forth in claim 1, wherein said first electronic component mounting step mounts said first electronic component by using a wire bonding process.

3. The method as set forth in claim 1, wherein a thermal expansibility of said organic substrate is about the same as a thermal expansibility of said concave molded resin enveloper.

4. The method as set forth in claim 1, further comprising a step of mounting a second electronic component on an opposite surface of said organic substrate to said first electronic component.

5. The method as set forth in claim 4, wherein said second electronic component mounting step mounts said second electronic component by using a wire bonding process.

6. The method as set forth in claim 5, further comprising a step of sealing said second electronic component by an approximately flat molded resin enveloper.

7. The method as set forth in claim 6, wherein said concave molded resin enveloper and said flat molded resin enveloper are made of a common material.

8. The method as set forth in claim 5, further comprising a step of sealing said second electronic component by a transfer molding process.

9. A method for manufacturing an electronic apparatus comprising the steps of:

preparing an organic base substrate having first and second surfaces and first and second electrode patterns formed on said first and second surfaces, respectively;

mounting a first frame on said first surface of said organic base substrate;

mounting a first semiconductor chip on said first surface of said organic base substrate and connecting said first semiconductor chip to said first electrode pattern by a wire bonding process;

introducing thermosetting resin into said first frame so that said first semiconductor chip is sealed by a concave molded resin enveloper;

mounting a second frame on said second surface of said organic base substrate;

mounting a second semiconductor chip on said second surface of said organic base substrate and connecting said second semiconductor chip to said second electrode pattern by a wire bonding process; and introducing thermosetting resin into said second frame so that said second semiconductor chip is sealed by an approximately flat molded resin enveloper.

10. A method for manufacturing an electronic apparatus comprising the steps of:

preparing an organic base substrate having first and second surfaces and first and second electrode patterns formed on said first and second surfaces, respectively;

mounting a first frame on said first surface of said organic base substrate;

mounting a first semiconductor chip on said first surface of said organic base substrate and connecting said first semiconductor chip to said first electrode pattern by a wire bonding process;

introducing thermosetting resin into said first frame so that said first semiconductor chip is sealed by a concave molded resin enveloper;

mounting a second semiconductor chip on said second surface of said organic base substrate and connecting said second semiconductor chip to said second electrode pattern by a wire bonding process; and sealing said second semiconductor chip by a transfer molding process.

11. A method for manufacturing an electronic apparatus comprising the steps of:

preparing an organic base substrate having first and second surfaces and first and second electrode patterns formed on said first and second surfaces, respectively;

mounting a first frame on said first surface of said organic base substrate;

mounting a semiconductor chip on said first surface of said organic base substrate and connecting said semiconductor chip to said first electrode pattern by a wire bonding process;

introducing thermosetting resin into said first frame so that said semiconductor chip is sealed by a concave molded resin enveloper;

mounting a second frame on said second surface of said organic base substrate;

mounting a mold component on said second surface of said organic base substrate and connecting said mold component to said second electrode pattern; and introducing thermosetting resin into said second frame so that said mold component is sealed by an approximately flat molded resin enveloper.

12. A method for manufacturing an electronic apparatus comprising the steps of:

preparing an organic substrate having a cavity;

mounting a first electronic component on said organic substrate within said cavity; and introducing liquid thermosetting resin into said cavity, wherein the thermosetting resin does not completely fill said cavity and wherein the viscosity and surface tension of said liquid thermosetting resin are adjusted so that the surface of said introduced resin is substantially concave; and heating and hardening said introduced resin to form a substantially concave envelope so that said first electronic component is sealed by said concave molded resin enveloper filled into said cavity.

13. A method for manufacturing an electronic apparatus comprising the steps of:

preparing an organic base substrate having first and second surfaces and first and second electrode patterns formed on said first and second surfaces respectively;

mounting a first frame on said first surface of said organic base substrate;

mounting a first semiconductor chip on said first surface of said organic base substrate and connecting said first semiconductor chip to said first electrode pattern by a wire bonding process introducing liquid thermosetting resin into said first frame wherein the thermosetting resin does not completely fill said frame and wherein the viscosity and surface tension of said liquid thermosetting resin are adjusted so that the surface of said introduced resin is substantially concave and heating and hardening said introduced resin to form a substantially concave envelope so that said first semiconductor chip is sealed by said concave molded resin enveloper;

mounting a second frame on said second surface of said organic base substrate;

mounting a second semiconductor chip on said second surface of said organic base substrate and connecting said second semiconductor chip to said second electrode pattern by a wire bonding process; and introducing thermosetting resin into said second frame so that said second semicondcuctor chip is sealed by an approximately flat molded resin enveloper.

14. A method for manufacturing an electronic apparatus comprising the steps of:

preparing an organic base substrate having first and second surfaces and first and second electrode patterns formed on said first and second surfaces, respectively;

mounting a first frame on said first surface of said organic base substrate;

mounting a first semiconductor chip on said first flat surface of said organic base substrate and connecting said first semiconductor chip to said first electrode pattern by a wire bonding process;

introducing liquid thermosetting resin into said first frame wherein the thermosetting resin does not completely fill said frame and wherein the viscosity and surface tension of said liquid thermosetting resin are adjusted so that the surface of said introduced resin is substantially concave and heating and hardening said introduced resin to form a substantially concave envelope so that said first semiconductor chip is sealed by said concave molded resin enveloper;

mounting a second semiconductor chip on said second surface of said organic base substrate and connecting said second semiconductor chip to said second electrode pattern by a wire bonding process; and sealing said second semiconductor chip by a transfer molding process.

15. A method for manufacturing an electronic apparatus comprising the steps of:

preparing an organic base substrate having first and second surfaces and first and second electrode patterns formed on said first and second surfaces, respectively;

mounting a first frame on said first surface of said organic base substrate;

mounting a semiconductor chip on said first surface of said organic base substrate and connecting said semiconductor chip to said first electrode pattern by a wire bonding process;

introducing thermosetting resin into said first frame so that said semiconductor chip is sealed by a concave molded resin enveloper;

introducing liquid thermosetting resin into said first frame wherein the thermosetting resin does not completely fill said frame and wherein the viscosity and surface tension of said liquid thermosetting resin are adjusted so that the surface of said introduced resin is substantially concave and heating and hardening said introduced resin to form a substantially concave envelope so that said semiconductor chip is sealed by said concave molded resin enveloper;

mounting a second frame on said second surface of said organic base substrate;

mounting a mold component on said second surface of said organic base substrate and connecting said mold component to said second electrode pattern; and introducing thermosetting resin into said second frame so that said mold component is sealed by a substantially flat molded resin enveloper.

16. The method of claim 12, wherein said thermosetting resin is an epoxy resin.

17. The method of claim 13, wherein said thermosetting resin is an epoxy resin.

18. The method of claim 14, wherein said thermosetting resin is an epoxy resin.

19. The method of claim 15, wherein said thermosetting resin is an epoxy resin.

* * * * *